United States Patent [19]

Ryu

[11] Patent Number: 5,877,941
[45] Date of Patent: Mar. 2, 1999

[54] IC CARD AND METHOD OF FABRICATING THE SAME

[75] Inventor: Jae-chul Ryu, Yongin, Rep. of Korea

[73] Assignee: Samsung Aerospace Industries, Ltd., Changwon, Rep. of Korea

[21] Appl. No.: 842,211

[22] Filed: Apr. 24, 1997

[30] Foreign Application Priority Data

Apr. 25, 1996 [KR] Rep. of Korea .................. 1996-12945

[51] Int. Cl.⁶ .................................................. H05K 01/18
[52] U.S. Cl. ......................... 361/737; 361/736; 361/686; 361/752; 361/753; 257/678; 257/679; 257/684; 257/688; 257/690; 174/261; 174/260; 174/255; 174/52.2; 235/488; 235/489; 235/492; 235/441; 235/486
[58] Field of Search ...................... 235/488, 489, 235/490, 492, 441, 486; 174/261, 260, 255, 52.2; 257/678, 679, 684, 688, 689, 690, 699, 785; 361/737, 736, 679, 683, 684, 686, 752, 753

[56] References Cited

U.S. PATENT DOCUMENTS

| | | | |
|---|---|---|---|
| 5,013,900 | 5/1991 | Hoppe ....................................... | 235/492 |
| 5,272,374 | 12/1993 | Kodai et al. .............................. | 257/679 |
| 5,374,788 | 12/1994 | Endoh et al. ............................. | 174/266 |
| 5,502,893 | 4/1996 | Endoh et al. .............................. | 29/852 |
| 5,612,532 | 3/1997 | Iwasaki .................................... | 235/492 |

*Primary Examiner*—Leo P. Picard
*Assistant Examiner*—David Foster
*Attorney, Agent, or Firm*—Finnegan, Henderson, Farabow, Garrett & Dunner, L.L.P.

[57] ABSTRACT

An IC card and a method of fabricating the same are provided in which the IC card substrate is formed of a blackened metal core plate to improve thermal, electrical and mechanical stability of the IC card.

5 Claims, 2 Drawing Sheets

FIG. 1
PRIOR ART
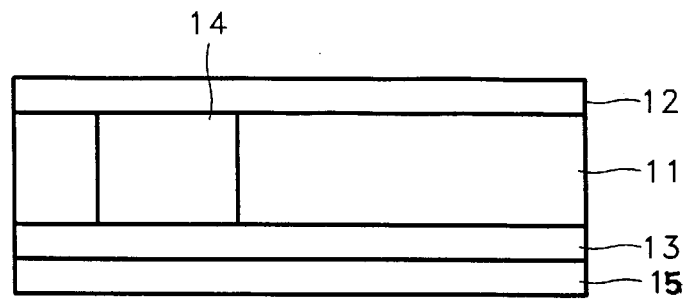
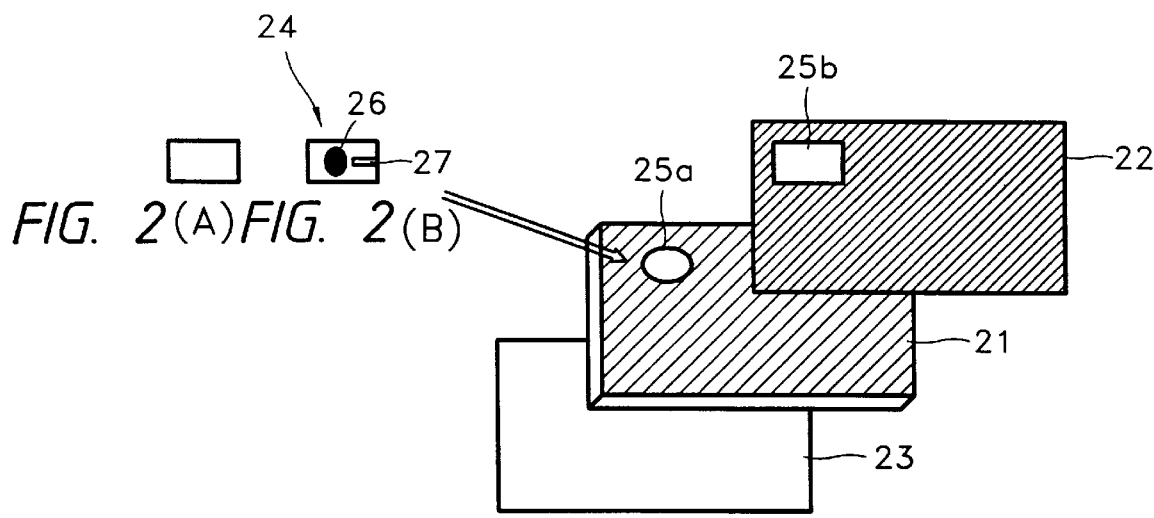
FIG. 2(A) FIG. 2(B)
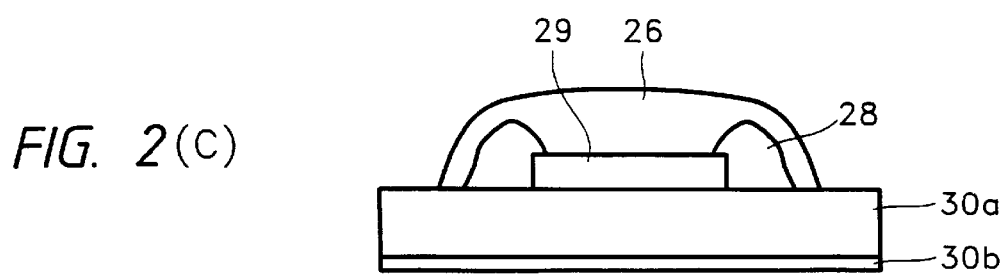
FIG. 2(C)

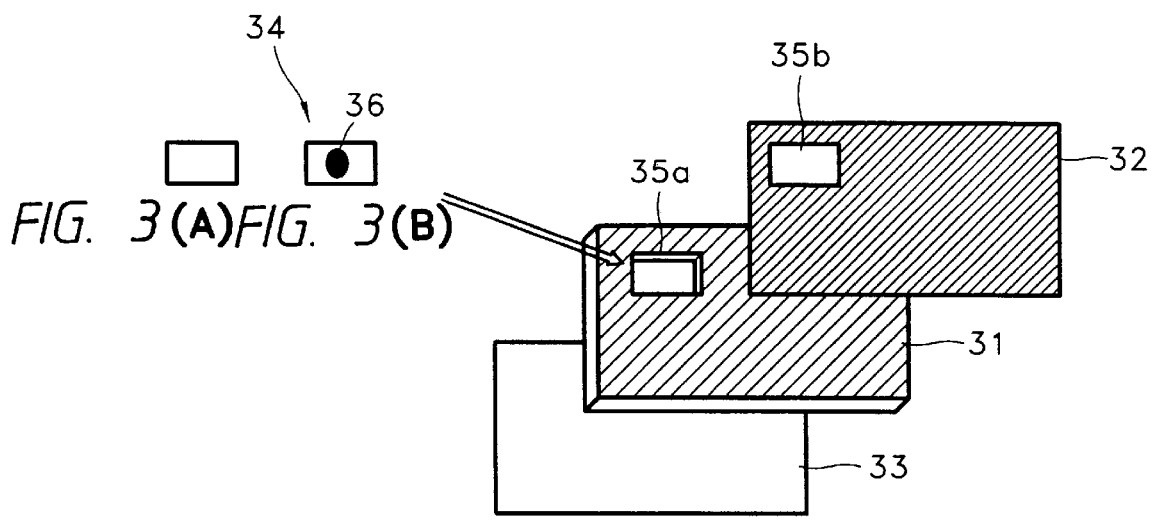

IC CARD AND METHOD OF FABRICATING THE SAME

BACKGROUND OF THE INVENTION

The present invention relates to an IC card and a method of fabricating the card, and more particularly, to an IC card with a built-in IC chip and a method of fabricating that card.

With the rapid development of fabricating techniques for a semiconductor chip, the size of the semiconductor chip is gradually being reduced to a size small enough to be built in a thin card, thus enabling development of a "smart card." The smart card includes a memory device for storing recorded information, an operating system, etc. The smart card is called an IC (integrated circuit) card and is also called a memory card, a chip-in-card, or an intelligent card.

Since the smart card has a built-in microprocessor semiconductor device, it is multi-functional, multi-purpose, and very secure. Because of this, the smart card has replaced existing magnetic cards and is widely used in various fields including banking, is medical service, and personal identification. The card may take the form of a telephone card, a cash card, a credit card, an I.D. card, a resident registration card, etc.

In general, the IC card includes an IC module having an IC chip and a series of connection terminals for transmitting and receiving data to and from an external device, and the IC module is generally placed in a card substrate.

Referring to FIG. 1, the conventional IC card has an IC module 14 mounted in a cavity of a card substrate 11. Card substrate 11 is generally made of synthetic resins. An over sheet layer 12 composed of synthetic resins is formed on card substrate 11. On the bottom surface of the card substrate, an inner sheet layer 13 and an under sheet layer 15 are sequentially formed.

The IC card having such a configuration has a large storage capacity, provides excellent security, and is easy to carry. For reliability reasons, it is necessary to protect the card main frame, including the mounted IC chip, against the environment when carried, i.e., from an external stress such as bending.

When the IC card is fabricated, a portion of card substrate 11 is etched to form a cavity in which IC module 14 is to be mounted. Accordingly, when the stresses due to bending are applied to the IC card, the cavity portion of the card substrate is increasingly subjected to stress and, thus, may be damaged.

Also, card substrate 11, made of synthetic resins, is prone to deformation due to heat generated from the chip or heat applied during thermal compression to adhere over sheet 12 and inner sheet layer 13 to the card substrate.

As described above, the conventional IC card may be deformed due to mechanical and thermal instability and, thus, is not reliable.

SUMMARY OF THE INVENTION

It is an object of the present invention to provide an IC card having improved thermal, electrical, and mechanical stability.

In an IC card according to the present invention, the IC card includes a card substrate, an IC module, and an over and under sheet layers. The card substrate has a cavity. The IC module is mounted in the cavity, and the over and under sheet layers are formed on the top and bottom surfaces of the card substrate, respectively. The card substrate is formed of a blackened metal core plate.

It is another object of the present invention to provide a method of fabricating the IC card.

A method of fabricating an IC card according to the present invention comprises the steps of: (a) forming a cavity in a metal core plate; (b) blackening the surface of the metal core plate to form a card substrate; (c) mounting an IC module in the cavity of the card substrate; (d) forming a cavity in an over sheet layers to correspond to the cavity in the card substrate; and (e) adhering the over sheet layer in which the cavity is formed to one surface of the card substrate and then adhering an under sheet layer without a cavity to the other surface of the card substrate.

The IC module preferably has a ground pattern. It is preferable that the cavity of card substrate is the same in size and shape as that of the over sheet layer or is formed in size and shape corresponding to a molding portion for sealing the IC module.

BRIEF DESCRIPTION OF THE DRAWINGS

The above objects and advantage of the present invention will become more apparent by describing in detail a preferred embodiment thereof with reference to the attached drawings in which:

FIG. 1 is a sectional view of a conventional IC card; and

FIGS. 2A–2C show an IC card fabricated according to a first embodiment of the present invention; and FIGS. 3A–3B show an IC card fabricated according to a second embodiment of the present invention.

DETAILED DESCRIPTION OF THE INVENTION

In an IC card of the present invention, a metal core plate is used for an IC card substrate, such that the IC card has enhanced thermal, electrical, and mechanical stability. The metal core plate has a structure in which synthetic resin layers are formed on the top and bottom surfaces of a central metal layer having high thermal conductivity and electrical conductivity. Examples of suitable metals are copper and aluminum. The synthetic resin is not limited particularly, but preferably is selected from the group consisting of vinyl chloride resin and polycarbonate resin.

The present invention will be described more in detail referring to the attached drawings.

Referring to FIG. 2, a cavity 25a is formed in a metal core plate and the metal core plate is treated to create blackened surfaces. The metal core is then used to form a card substrate 21. Because a metal core plate with high thermal conductivity and electrical conductivity is used for the card substrate, heat generated from a chip is dissipated with relative ease, and electrical stability can be obtained due to grounding of the metal core plate with a micromodule. Unlike the conventional IC card, the metal core plate is mechanically stable by virtue of physical properties of the central metal, and a special inner sheet layer is not necessary. Further, adhesiveness between card substrate 21 and an over sheet layer 22 is enhanced due to the blackening of the surface of the card substrate.

An IC module 24 is mounted in cavity 25a of card substrate 21. An over sheet layer 22 having a cavity 25b corresponding to cavity 25a of card substrate 21 is adhered to one surface of the card substrate. Then, an under sheet layer 23 without a cavity is adhered to the other surface of the card substrate, thereby completing the IC card of the present invention.

FIGS. 2(A), (B) and (C) show front, rear and side views, respectively, of an IC module according to an embodiment of the present invention. IC module 24 may have a grounding pattern 27. The grounding pattern contacts card substrate 21 to act as a ground. As shown in FIG. 2C, IC module 24 includes an IC chip 29, a module substrate 30*a*, connection terminals 30*b*, a molding portion 26 for mounting and sealing IC chip 29 on module substrate 30*a*, and a metal wire 28. Molding portion 26 may be formed from any material that is typically used for this purpose. For example, acrylic resins and epoxy resins are usually employed.

FIG. 3 shows an IC card according to another preferred embodiment of the present invention. In this IC card, the cavity 35*a* in the card substrate 31 corresponds to the cavity 35*b* of the over sheet layer 32, and an under sheet layer 33 without an opening is provided. The IC module 34 is mounted in cavity 35*a*. As shown in FIG. 3, when the size and shape of card machine cavity 35*a* is the same as that of cavity 35*b* of over sheet layer 32 or that of molding portion 36, stress applied to a module attaching area of a card substrate is reduced. When external physical forces are applied to the card, deformation of the card due to the effects of the stress can be prevented.

A method of forming an IC card according to the present invention generally includes the following. A material is selected for the metal core plate, and a cavity is formed in the metal core plate. The top and bottom surfaces of the metal core plate are then blackened to form a card substrate. An IC module is then mounted within the cavity of the card substrate. A cavity is formed in an over sheet layer to correspond to the cavity in the card substrate. The cavity in the over sheet layer may or may not correspond in size and shape to either the cavity of the card substrate or the IC module molding portion. The over sheet layer in which the cavity is formed is adhered to one surface of the card substrate, and an under sheet layer without a cavity is adhered to the other surface of the card substrate. If desired, a grounding pattern can be formed on the IC module before the module is placed within the cavity of the card substrate.

When a synthetic resin is used for a card substrate according to prior art, the card substrate is prone to deformation or the chip is frequently cracked due to heat generated from the chip or heat applied during thermal compression to adhere the over sheet layer to the card substrate. In contrast, the IC card of the present invention uses a metal core plate having high thermal conductivity and electrical conductivity as a card substrate, and over and under sheet layers made of synthetic resins are formed on the top and bottom surfaces of the card substrate, respectively. Accordingly, heat generated from a chip is easily dissipated and deformation of the card due to heat is reduced. Also, the IC card of the present invention is electrically stable since it is grounded with a module. Additionally, deformation of the card due to the physical stress is reduced.

What is claimed is:

1. An IC card comprising:
    a card substrate having a cavity;
    an IC module having an IC chip, a series of connection terminals for transmitting and receiving data to and from an external device, and a grounding pattern formed on it, and being mounted in said cavity of the card substrate;
    an oversheet layer having a cavity and attached to a top surface of said card substrate; and
    an under sheet layer attached to a bottom surface of said card substrate, wherein the card substrate is a metal plate and in contact with the grounding pattern formed on the IC module.

2. The IC card of claim 1, wherein the metal core plate has a central metal layer which metal is one selected from the group consisting of aluminum and copper.

3. The IC card of claim 1, wherein the IC module includes a molding portion and the cavity of the card substrate corresponds in size and shape to the molding portion.

4. The IC card of claim 1, wherein the over sheet layer includes a cavity and the cavity of the over sheet layer corresponds in size and shape to the cavity of the card substrate.

5. The IC card of claim 1, wherein the metal plate is a blackened metal core plate.

\* \* \* \* \*